(12) United States Patent
Brask et al.

(10) Patent No.: US 6,855,639 B1
(45) Date of Patent: Feb. 15, 2005

(54) PRECISE PATTERNING OF HIGH-K FILMS

(75) Inventors: Justin K. Brask, Portland, OR (US); Mark L. Doczy, Beaverton, OR (US); Matthew V. Metz, Hillsboro, OR (US); John Barnak, Portland, OR (US); Paul R. Markworth, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/632,470

(22) Filed: Aug. 1, 2003

(51) Int. Cl.⁷ .................. H01L 21/302; H01L 21/461
(52) U.S. Cl. .................. 438/742; 438/705; 438/745
(58) Field of Search .................. 438/705, 745, 438/751, 704, 742

(56) References Cited

U.S. PATENT DOCUMENTS 6,300,202 B1 * 10/2001 Hobbs et al. ............... 438/287

FOREIGN PATENT DOCUMENTS

| JP | 54024236 | * | 2/1979 | ............. C23C/1/02 |
| JP | 2153082 | * | 6/1990 | ............. C23F/1/46 |
| JP | 2000036572 | * | 2/2000 | ......... H01L/27/108 |
| JP | 2001213696 | * | 8/2001 | ........... C30B/29/06 |

* cited by examiner

Primary Examiner—Caridad Everhart
(74) Attorney, Agent, or Firm—Michael D. Plimier (57) ABSTRACT

A high-K thin film patterning solution is disclosed to address structural and process limitations of conventional patterning techniques. Subsequent to formation of gate structures adjacent a high-K dielectric layer, a portion of the high-K dielectric layer material is reduced, preferably via exposure to hydrogen gas, to form a reduced portion of the high-K dielectric layer. The reduced portion may be selectively removed utilizing wet etch chemistries to leave behind a trench of desirable geometric properties.

32 Claims, 6 Drawing Sheets

PRECISE PATTERNING OF HIGH-K FILMS

FIELD OF THE INVENTION

This invention relates to fabricating microelectronic devices, and more particularly to precision formation of a trench in a dielectric layer.

BACKGROUND OF THE INVENTION

Figure 1A:
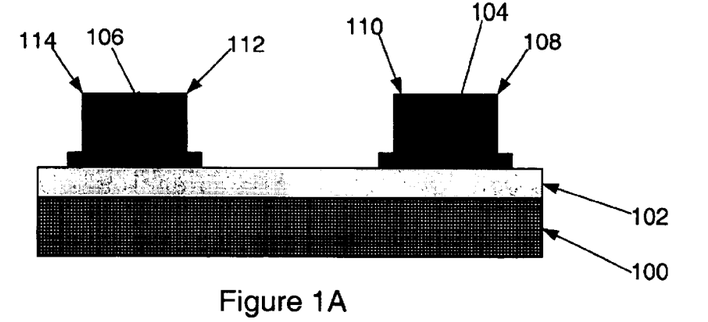
FIGS. 1A–1C, are cross-sectional depictions of conventional substrate patterning treatment.
Figure 1B:
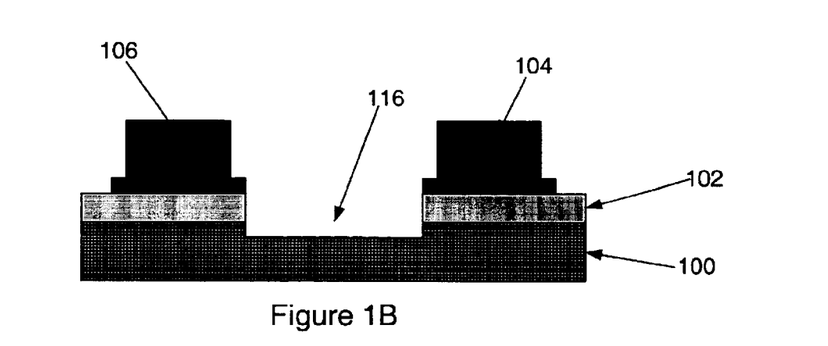
Figure 1C:
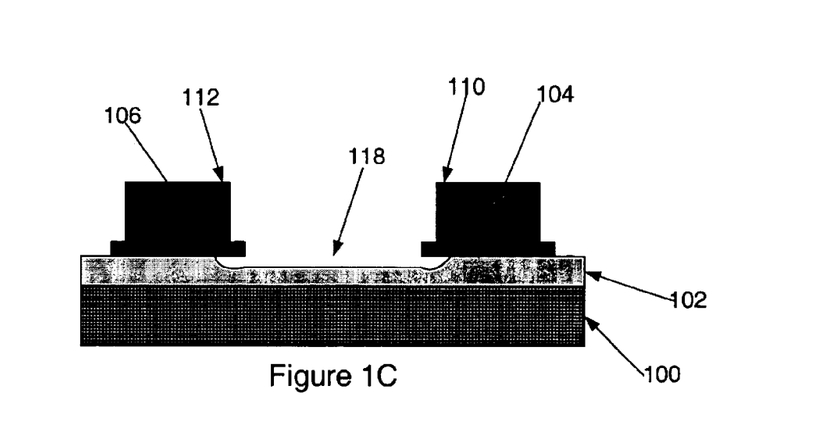

Microelectronic structures, such as semiconductor structures, may be created by forming layers and trenches in various structural configurations from various materials. One of the challenges associated with conventional techniques utilized for patterning dielectric films, such as high dielectric constant, or "high-K", films is trenching with accuracy to avoid damage to the integrity of adjacent structures. Referring to FIG. 1A, a cross-sectional view of a typical gate structure is depicted wherein two gates (104, 106) with spacers (108, 110, 112, 114) are formed adjacent a high-K gate oxide layer (102), which is formed adjacent a substrate layer (100). FIG. 1B depicts an undesirable patterning scenario wherein dry etching techniques have been utilized, resulting in a trench (116) that is overdeep. While the relatively anisotropic properties of dry etching techniques are favored for minimizing negative etch bias, they may be associated with difficulty in controlling trenching depth, as depicted, for example, in FIG. 1B, where the trench (116) extends undesirably into the substrate layer (100). FIG. 1C depicts another undesirable patterning scenario wherein wet etching has been utilized, resulting in a trench (118) that undesirably undercuts neighboring structures such as gates (104, 106) and spacers (110, 112). Many wet etching treatments are associated with substantially isotropic etch rate characteristics, resulting in negative etch bias and undercutting, as depicted, for example, in FIG. 1C.

BRIEF DESCRIPTION OF THE DRAWINGS

The present invention is illustrated by way of example and is not limited in the figures of the accompanying drawings, in which like references indicate similar elements. Features shown in the drawings are not intended to be drawn to scale, nor are they intended to be shown in precise positional relationship.

DETAILED DESCRIPTION

In the following detailed description of embodiments of the invention, reference is made to the accompanying drawings in which like references indicate similar elements. The illustrative embodiments described herein are disclosed in sufficient detail to enable those skilled in the art to practice the invention. The following detailed description is therefore not to be taken in a limiting sense, and the scope of the invention is defined only by the appended claims.

Figure 2A:
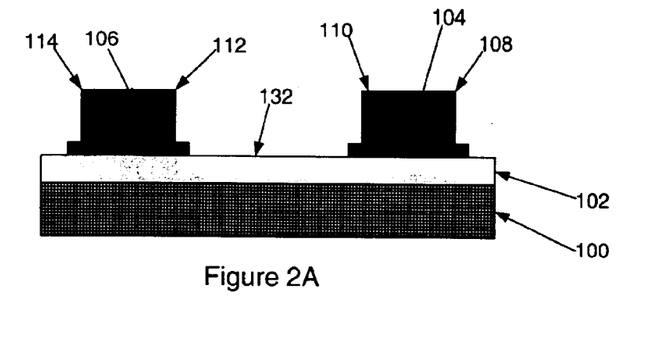
FIGS. 2A–2C are cross sectional views of various aspects of a patterning treatment of an embodiment of the present invention.
Figure 2B:
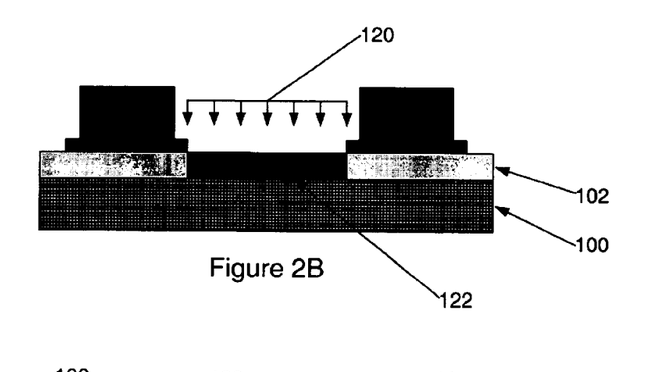
Figure 2C:
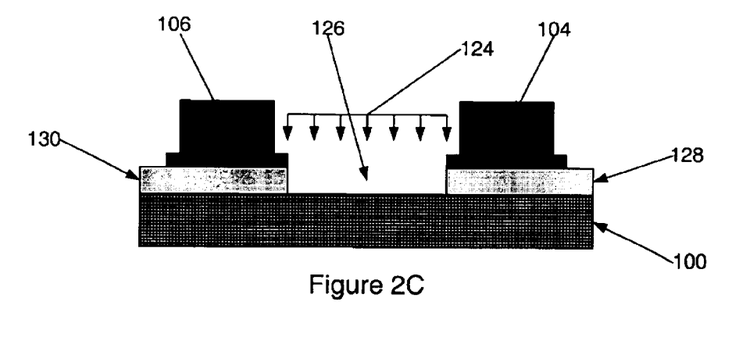

FIGS. 2A–2C are cross sectional views of various aspects of a patterning treatment of one embodiment of the present invention. Referring to FIG. 2A, a microelectronic structure similar to that depicted in FIG. 1A is shown. Such a structure may be formed utilizing various techniques and materials. For example, a high-K dielectric layer (102) may be formed upon a substrate layer (100) using techniques such as chemical or physical vapor deposition or other techniques. In various embodiments, the high-K dielectric layer (102) may comprise a high-K material such as hafnium dioxide, zirconium dioxide, or silicate derivatives thereof, and the substrate layer (100) may comprise a semiconducting material such as silicon, or another material. Subsequently, gates (104, 106) may be formed between spacers (108, 110, 112, 114). In an embodiment, the gates (104, 106) comprise a gate material such as polysilicon and the spacers (108, 110, 112, 114) comprise a spacer material such as silicon nitride, although other materials may be used in other embodiments. Subsequent to formation of the gates (104, 106) and spacers (108, 110, 112, 114), a portion (132) of the high-K dielectric layer (102) surface remains exposed.

Referring to FIG. 2B, the exposed high-K dielectric layer surface (132) is exposed to hydrogen (120), resulting in a hydrogen reduction reaction. Reduction of d-block (between groups II and III on the Periodic Table) transition metal complexes/films with molecular hydrogen to the corresponding metallic species is a well-known phenomenon, described, for example, in publications such as "Chemistry of the Elements", $2^{nd}$ Edition, by N. N. Greenwood and A. Earnshaw, 1997. Hydrogen tunnels in the direction in which it is applied easily into such films to depths commonly encountered in high-K microelectronic device structures, such as between about 5 and about 100 angstroms, in a substantially anisotropic manner.

In an embodiment, the exposed surface (132) is exposed to hydrogen (120) in a parallel plate plasma chamber, where a device wafer that includes the gates (104, 106), high-K dielectric layer (102), and substrate layer (100) acts as one plate, and is spaced in a range of about 5 mm to about 10 mm from a second plate. There is a radio frequency ("RF") power source with a power density in a range of about 2 $W/cm^2$ to about 4 $W/cm^2$, and a frequency in a range of about 200 kHz to about 13.5 MHz. The temperature of the wafer is in a range from about 20° C. to about 450° C. There is a hydrogen flow rate in a range of about 1000 SCCM to about 2000 SCCM and a flow rate of an inert gas such as argon or helium in a range of about zero SCCM to about 2000 SCCM. The chamber has a pressure in a range of about 1 Torr to about 2 Torr. Other embodiments may use different conditions to perform the hydrogen reduction reaction.

In an embodiment wherein the high-K gate dielectric (102) comprises hafnium dioxide, the hydrogen reduction reaction may be notated as follows:

$HfO_2 + 2H_2 \rightarrow Hf + 2H_2O$

The result of the reduction reaction is a reduced portion (122) of the high-K gate dielectric layer (102). The reduced, or "converted" portion (122), now a metallic substance, may be selectively removed, as depicted in FIG. 2C, via exposure to a wet etch chemistry (124) selective to the converted metallic, such as the sulfuric acid and hydrogen peroxide based etch chemistry known as a "piranha" etch chemistry, or a hydrochloric acid and hydrogen peroxide based wet etch chemistry known as an "SC2" or "RCA standard clean 2" wet etch chemistry, to leave behind a trench (126). Removal of the reduced portion (122) also results in remaining discrete portions (128, 130) of the high-K dielectric layer (102). The trench (126) is without substantial negative etch bias or damage to the underlying substrate layer (100) due to the relatively high selectivity of such wet etch chemistry (124) to metallics as opposed to other adjacent nonmetallic materials, including adjacent portions of the high-K gate dielectric (102) which have not been reduced or converted. Indeed, the trench (126) resulting from the removal of reduced material (122) is substantially straight with substantially parallel walls—also known in the art as a trench having substantially zero positive or negative "etch bias." Wet etch chemistries (124) such as piranha and SC2 are well known in the art as systems for selectively removing organics and metallics to reach underlying metallic or substrate materials. For example, a low pH system with an oxidant, such as hydrochloric acid with peroxide as in the SC2 etch chemistry, is a known effective way to dissolve metallics. In other embodiments, other methods such as an aqueous solution of a common chelating agent, derivatives of phosphonates or ethylenediaminetetraacetic acid for example, may be used to selectively remove the reduced portion (122). Thus, the dielectric layer (102) is patterned with precision to avoid problems with: eroding an underlying substrate layer (100) and undercutting adjacent structures, such as gates (104, 106) or spacers (108, 110, 112, 114).

Figure 3:
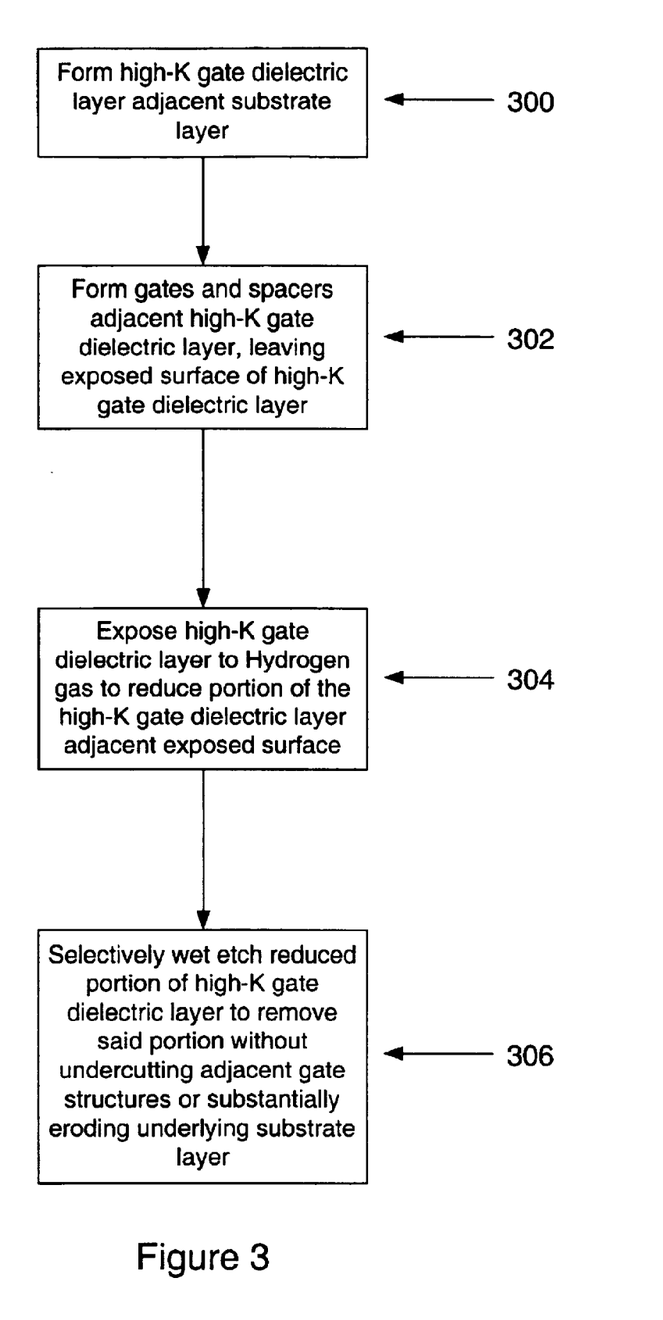
FIG. 3 is a flowchart, depicting various stages of a patterning treatment of an embodiment of the present invention.

Referring to FIG. 3, a flowchart summarizing a patterning treatment of one embodiment of the present invention is depicted, wherein a high-K gate dielectric layer is formed (300) adjacent a substrate layer, subsequent to which gates and spacers are formed (302) adjacent the high-K gate dielectric layer, leaving an exposed surface of the high-K gate dielectric layer. The exposed high-K gate dielectric layer surface is exposed (304) to hydrogen gas, which leads to a reduction reaction. The reduced high-K gate dielectric material is etched (306) to form a trench by a wet etch chemistry that is selective to the reduced high-K gate dielectric material so that the reduced gate dielectric material is selectively removed without substantially undercutting adjacent gate structures or substantially eroding underlying substrate layer materials.

Figure 4A:
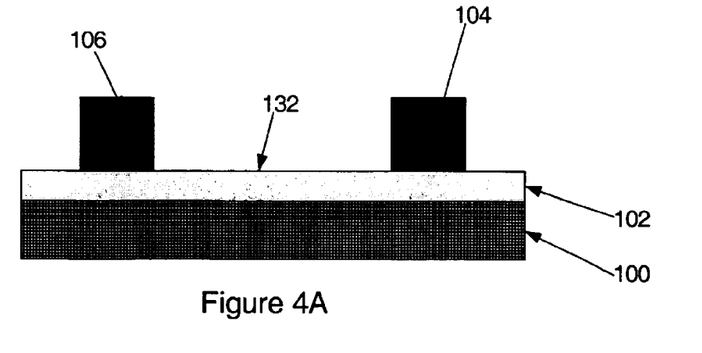
FIGS. 4A–4D are cross sectional views of various aspects of a patterning treatment of a second embodiment of the present invention.
Figure 4B:
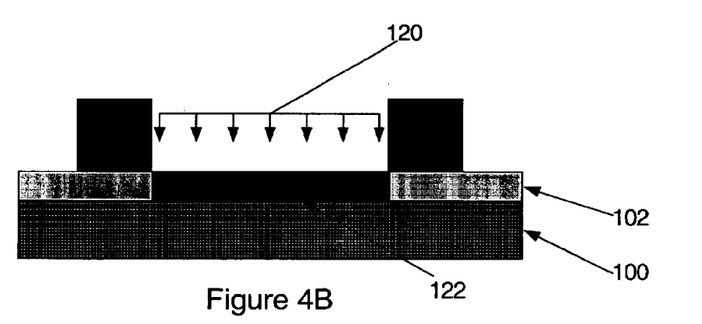

FIGS. 4A–4D are cross sectional views of various aspects of a patterning treatment of a second embodiment of the present invention. Referring to FIG. 4A, a microelectronic structure similar to that depicted in FIG. 2A is shown. However, the structure in FIG. 4A does not include spacers (108, 110, 112, 114) adjacent the gates (104, 106). Such a structure may be formed utilizing various techniques and materials. For example, a high-K dielectric layer (102) may be formed upon a substrate layer (100) using techniques such as chemical or physical vapor deposition or other techniques. In various embodiments, the high-K dielectric layer (102) may comprise a high-K material such as hafnium dioxide, zirconium dioxide, or silicate derivatives thereof, and the substrate layer (100) may comprise a semiconducting material such as silicon, or another material. Subsequently, gates (104, 106) may be formed on the high-K dielectric layer (102). In an embodiment, the gates (104, 106) comprise a gate material such as polysilicon, although other materials may be used in other embodiments. Subsequent to formation of the gates (104, 106), a portion (132) of the high-K dielectric layer (102) between the gates (104, 106) remains exposed.

Figure 4C:
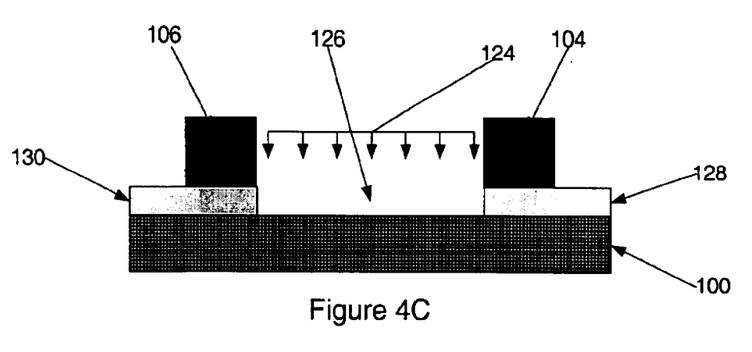

Referring to FIG. 4H, the exposed high-K dielectric layer surface (132) is exposed to hydrogen (120), resulting in a hydrogen reduction reaction. In an embodiment, this exposure is performed similarly to the exposure described above with respect to FIG. 2B, with the same result of a reduced portion (122) of the high-K gate dielectric layer (102). The reduced, or "converted" portion (122), now a metallic substance, may be selectively removed, as depicted in FIG. 4C, via exposure to a wet etch chemistry (124) selective to the converted metallic to leave behind a trench (126). This wet etch chemistry (124) is typically performed in the same manner as described above with respect to FIG. 2C. Removal of the reduced portion (122) also results in remaining discrete portions (128, 130) of the high-K dielectric layer (102). The trench (126) is without substantial negative etch bias or damage to the underlying substrate layer (100) due to the relatively high selectivity of such wet etch chemistry (124) to metallics as opposed to other adjacent nonmetallic materials, including adjacent portions of the high-K gate dielectric (102) which have not been reduced or converted. Indeed, the trench (126) resulting from the removal of reduced material (122) is substantially straight with substantially parallel walls—also known in the art as a trench having substantially zero positive or negative "etch bias." Thus, the dielectric layer (102) is patterned with precision to avoid problems with eroding an underlying substrate layer (100) and undercutting adjacent structures, such as gates (104, 106).

Figure 4D:
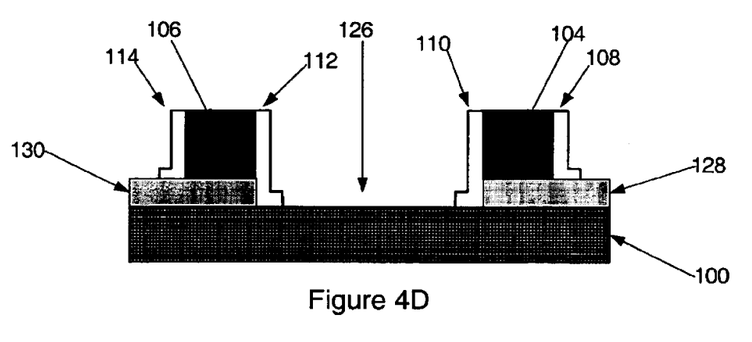

Referring to FIG. 4D, spacers (108, 110, 112, 114) are then formed adjacent to the gates (104, 106) and the discrete portions (128, 130) of the high-K dielectric layer (102). As shown in FIG. 4D, spacers (110, 112) are formed adjacent to both gates (104, 106) and discrete portions (128, 130) of the high-K dielectric layer (102), and extend from substantially a top surface of the gates (104, 106) into the trench (126) and to a top surface of material exposed by removal of the reduced portion (122) of the high-K dielectric layer (102). The top surface of material exposed by removal of the reduced portion (122) of the high-K dielectric layer is the bottom surface of the trench, which is the top surface of the substrate layer (100) in the illustrated embodiment. In an illustrated embodiment, a trench (126) is formed on one side of each of the gates (104, 106). The high-K dielectric layer (102) remains on a non-trench side of the gates (104, 106). In such an embodiment, spacers (108, 114) on the non-trench side of the gates (104, 106) are formed adjacent to the gates (104, 106) and extend from substantially the top surface of the gates (104, 106) to top surfaces of the discrete portions (128, 130) of the high-K dielectric layer (102). In other embodiments (not illustrated) however, trenches (126) may be formed on both sides of one or both of the gates (104, 106). In these other embodiments, one or both of spacers (108, 114) on the non-trench side of the gates (104, 106) may also be formed adjacent to both gates (104, 106) and discrete portions (128, 130) of the high-K dielectric layer (102), and extend from substantially a top surface of the gates (104, 106) into the trench (126) and to a top surface of the substrate layer (100) exposed by removal of the reduced portion (122) of the high-K dielectric layer (102). Thus, the dielectric layer (102) is patterned with precision to avoid problems with eroding an underlying substrate layer (100) and undercutting adjacent structures, such as gates (104, 106) or spacers (108, 110, 112, 114).

Figure 5:
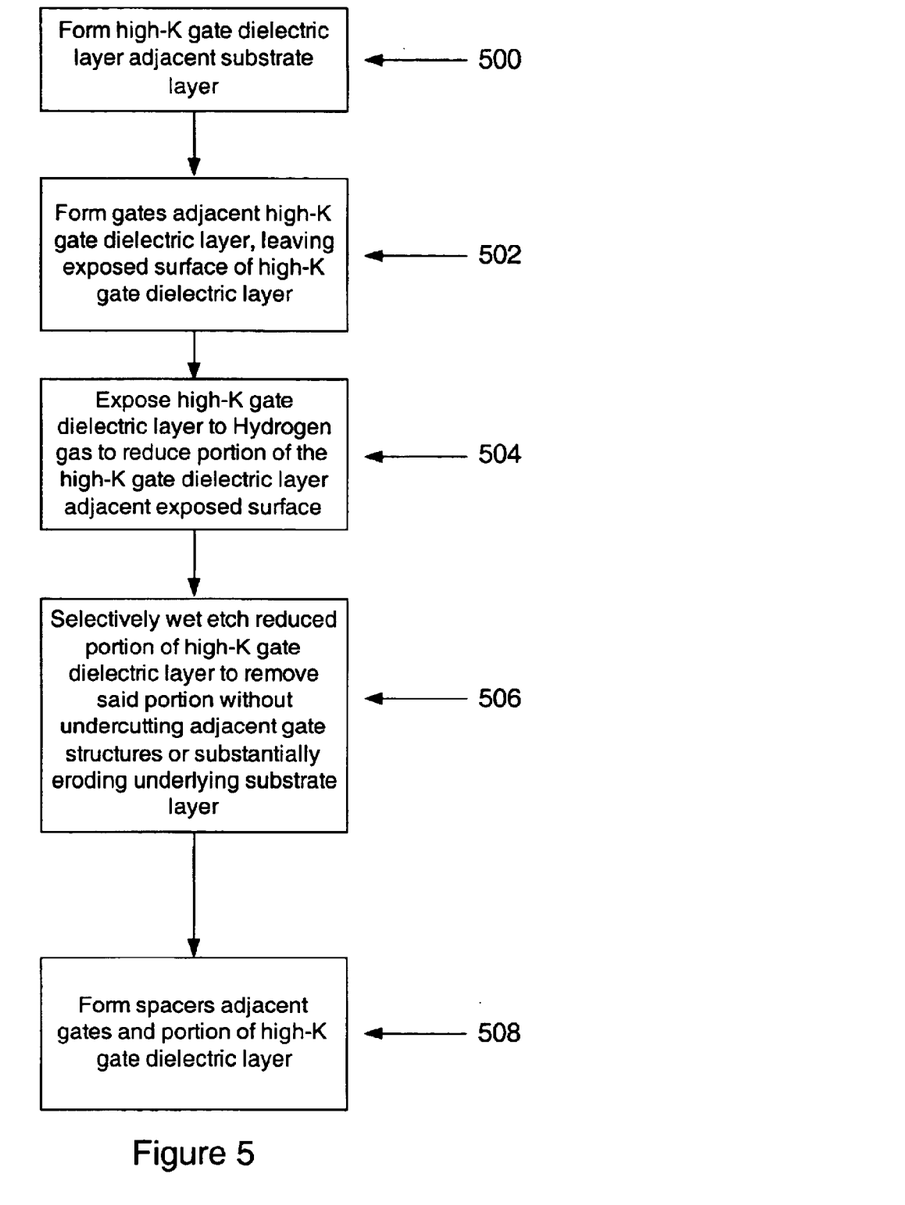
FIG. 5 is a flowchart depicting various stages of a patterning treatment of the second embodiment of the present invention.

Referring to FIG. 5, a flowchart summarizing a patterning treatment of one embodiment of the present invention is depicted, wherein a high-K gate dielectric layer is formed (500) adjacent a substrate layer, subsequent to which gates are formed (502) adjacent the high-K gate dielectric layer, leaving an exposed surface of the high-K gate dielectric layer. The exposed high-K gate dielectric layer surface is exposed (504) to hydrogen gas, which leads to a reduction reaction. The reduced high-K gate dielectric material is etched (506) to form a trench by a wet etch chemistry that is selective to the reduced high-K gate dielectric material so that the reduced gate dielectric material is selectively removed without substantially undercutting adjacent gate structures or substantially eroding underlying substrate layer materials. Then, spacers are formed (508) adjacent the gates and a portion of the remaining high-K gate dielectric layer. On sides of the gates adjacent the trench, these spacers extend substantially from the top surface of the gates to the top surface of the substrate layer.

Thus, a novel substrate patterning solution is disclosed. Although the invention is described herein with reference to specific embodiments, many modifications therein will readily occur to those of ordinary skill in the art. Accordingly, all such variations and modifications are included within the intended scope of the invention as defined by the following claims.

What is claimed is:

1. A method comprising:
   forming a layer of high-K dielectric material on a layer of substrate material;
   forming at least a first gate and a second gate on the layer of high-K dielectric material, leaving an exposed portion of the high-K material between the first and second gates;
   exposing the exposed portion of the layer of high-K dielectric material to hydrogen to reduce the exposed portion to form a metallic portion from the exposed portion;
   removing the metallic portion from the layer of high-K material by exposing the metallic portion to a wet chemical etchant selective to the metallic portion to form a trench;
   forming spacers adjacent to the first gate and the second gate; and
   wherein forming the spacers comprises forming the spacers adjacent the gates after removing the metallic portion from the layer of high-K material.

2. The method of claim 1 wherein at least one spacer extends from substantially a top surface of one of the first and second gates into the trench to a bottom surface of the trench.

3. The method of claim 1 wherein forming the spacers comprises forming the spacers before exposing the exposed portion of the layer of high-K dielectric material to hydrogen.

4. The method of claim 3 wherein the spacers extend from substantially the top surface of the gates to which that spacer is adjacent to a top surface of the layer of high-K dielectric material.

5. The method of claim 1 wherein the high-K dielectric material comprises Hafnium dioxide and wherein the metallic portion comprises Hafnium.

6. The method of claim 1 wherein the high-K dielectric material comprises Zirconium dioxide and wherein the metallic portion comprises Zirconium.

7. The method of claim 1 wherein exposing the exposed portion of the layer of high-K dielectric material to hydrogen comprises exposing the exposed portion of the layer of high-K dielectric material to hydrogen in a plasma chamber.

8. The method of claim 7 wherein the layer of high-K dielectric material is disposed in the plasma chamber at a distance from a plate ranging from about 5 mm to about 10 mm.

9. The method of claim 7 wherein exposing the exposed portion of the layer of high-K dielectric material to hydrogen comprises exposing the exposed portion of the layer of high-K dielectric material to hydrogen at a flow rate that ranges from about 1000 SCCM to about 2000 SCCM.

10. A method comprising:
    forming a layer of high-K dielectric material on a substrate;
    forming at least a first gate and a second gate on the layer of high-K dielectric material, leaving an exposed portion of the high-K material between the first and second gates;
    exposing the exposed portion of the layer of high-K dielectric material to hydrogen to reduce the exposed portion of the layer of high-K dielectric material to form a metallic portion from the exposed portion;
    removing the metallic portion from the layer of high-K material by exposing the metallic portion to a wet chemical etchant selective to the metallic portion to form a trench between the first gate and the second gate, while leaving discrete portions of the high-K material on sides of the first and second gates opposite the trench;
    forming a first spacer on a side of the first gate adjacent the trench, the first spacer extending from substantially a top surface of the gate into the trench to a bottom surface of the trench; and
    forming a second spacer on a side of the first gate opposite the trench, the second spacer extending from substantially the top surface of the gate to the discrete portion of the high-K material.

11. The method of claim 10 wherein the high-K dielectric material comprises Hafnium dioxide and wherein the metallic portion comprises Hafnium.

12. The method of claim 10 wherein the high-K dielectric material comprises Zirconium dioxide and wherein the metallic portion comprises Zirconium.

13. The method of claim 10 wherein exposing the exposed portion of the layer of high-K dielectric material to hydrogen comprises exposing the exposed portion of the layer of high-K dielectric material to hydrogen in a plasma chamber.

14. The method of claim 13 wherein the layer of high-K dielectric material is disposed in the plasma chamber at a distance from a plate ranging from about 5 mm to about 10 mm.

15. The method of claim 13 wherein exposing the exposed portion of the layer of high-K dielectric material to hydrogen comprises exposing the exposed portion of the layer of high-K dielectric material to hydrogen at a flow rate that ranges from about 1000 SCCM to about 2000 SCCM.

16. The method of claim 10 wherein the wet chemical etchant comprises a sulfuric acid and hydrogen peroxide based etch chemistry.

17. The method of claim 16 wherein the etch chemistry is a piranha etch chemistry.

18. The method of claim 10 wherein the wet chemical etchant comprises a hydrochloric acid and hydrogen peroxide based etch chemistry.

19. The method of claim 18 wherein the etch chemistry is an SC2 etch chemistry.

20. A method comprising:
    forming a layer of high-K dielectric material on a layer of substrate material;
    forming at least a first gate and a second gate on the layer of high-K dielectric material, leaving an exposed portion of the high-K material between the first and second gates, wherein each of the first gate and the second gate has a bottom surface;

exposing the exposed portion of the layer of high-K dielectric material to hydrogen to reduce the exposed portion to form a metallic portion from the exposed portion;

removing the metallic portion from the layer of high-K material by exposing the metallic portion to a wet chemical etchant selective to the metallic portion to form a trench between the first gate and the second gate;

forming a first spacer adjacent to a first side of the first gate adjacent the trench, the first spacer extending from a position above the bottom surface of the first gate to extend into the trench to a position below the bottom surface of the first gate.

21. The method of claim 20 wherein the wet chemical etchant comprises a sulfuric acid and hydrogen peroxide based etch chemistry.

22. The method of claim 21 wherein the etch chemistry is a piranha etch chemistry.

23. The method of claim 20 wherein the wet chemical etchant comprises a hydrochloric acid and hydrogen peroxide based etch chemistry.

24. The method of claim 23 wherein the etch chemistry is an SC2 etch chemistry.

25. The method of claim 20 wherein the high-K dielectric material comprises Hafnium dioxide and wherein the metallic portion comprises Hafnium.

26. The method of claim 20 wherein the high-K dielectric material comprises Zirconium dioxide and wherein the metallic portion comprises Zirconium.

27. The method of claim 20, wherein the first spacer extends to a bottom surface of the trench.

28. The method of claim 20, wherein a portion of the layer of high-K material remains as a discrete portion on a second side of the first gate opposite the first side after formation of the trench between the first and second gates.

29. The method of claim 28, further comprising forming a second spacer adjacent the second side of the first gate, the second spacer extending from a position above the bottom surface of the first gate to the discrete portion.

30. The method of claim 20, wherein removing the metallic portion leaves an exposed portion of the substrate material at the bottom of the trench.

31. The method of claim 30, wherein the first spacer extends to the substrate material.

32. The method of claim 31, wherein a portion of the layer of high-K material remains as a discrete portion on a second side of the first gate opposite the first side after formation of the trench between the first and second gates and further comprising forming a second spacer adjacent the second side of the first gate, the second spacer extending from a position above the bottom surface of the first gate to the discrete portion.

* * * * *